United States Patent
Nebon et al.

(10) Patent No.: US 6,680,615 B2
(45) Date of Patent: Jan. 20, 2004

(54) METHOD AND DEVICE FOR CHECKING THE CHARGE STATE OF A BATTERY, IN PARTICULAR A RECHARGEABLE BATTERY FOR A CELLULAR MOBILE TELEPHONE

(75) Inventors: Jérôme Nebon, Grenoble (FR); Louis Tallaron, Saint-Egreve (FR)

(73) Assignee: STMicroelectronics SA, Montrouge (FR)

( * ) Notice: Subject to any disclaimer, the term of this patent is extended or adjusted under 35 U.S.C. 154(b) by 36 days.

(21) Appl. No.: 10/174,526

(22) Filed: Jun. 18, 2002

(65) Prior Publication Data

US 2003/0011372 A1 Jan. 16, 2003

(30) Foreign Application Priority Data

Jun. 19, 2001 (FR) .............................. 01 08053

(51) Int. Cl.[7] .......................................... G01N 27/416
(52) U.S. Cl. .................... 324/426; 324/428; 324/678
(58) Field of Search ....................... 320/132; 324/76.11, 324/77.11, 426, 428, 433, 649, 658, 676, 678; 341/166; 361/97; 377/49

(56) References Cited

U.S. PATENT DOCUMENTS

| 5,600,247 | A | | 2/1997 | Matthews | 324/426 |
|---|---|---|---|---|---|
| 5,614,902 | A | | 3/1997 | Hopkins | 341/118 |
| 5,998,971 | A | | 12/1999 | Corbridge | 320/132 |
| 6,049,210 | A | * | 4/2000 | Hwang | 324/428 |
| 6,051,957 | A | * | 4/2000 | Klein | 320/132 |
| 6,218,809 | B1 | * | 4/2001 | Downs et al. | 320/132 |
| 6,236,214 | B1 | * | 5/2001 | Camp et al. | 324/427 |
| 6,339,315 | B1 | * | 1/2002 | Castelli et al. | 320/136 |
| 6,577,135 | B1 | * | 6/2003 | Matthews et al. | 324/426 |
| 2001/0009361 | A1 | * | 7/2001 | Downs et al. | 320/132 |

FOREIGN PATENT DOCUMENTS

| EP | 0952456 | 10/1999 | G01R/31/36 |
|---|---|---|---|
| EP | 1037065 | 9/2000 | G01R/31/36 |
| WO | 99/19983 | 4/1999 | H03K/7/06 |

* cited by examiner

Primary Examiner—N. Le
Assistant Examiner—Walter Benson
(74) Attorney, Agent, or Firm—Allen, Dyer, Doppelt, Milbrath & Gilchrest, P.A.; Lisa K. Jorgenson

(57) ABSTRACT

The amount of charge passing through a measurement resistor connected to a rechargeable battery is measured by integrating in an analog manner an overall current. This overall current is equal to the sum of the resistor current and of a reference current that selectively takes one of two opposite values. The results of the integration are compared with a reference voltage, and one of two opposite values of the reference current is selected depending on each result of the comparison. The number of times where the positive opposite value of the reference current is selected furnishes an indication on the amount of charge during the integration time.

34 Claims, 5 Drawing Sheets

METHOD AND DEVICE FOR CHECKING THE CHARGE STATE OF A BATTERY, IN PARTICULAR A RECHARGEABLE BATTERY FOR A CELLULAR MOBILE TELEPHONE

FIELD OF THE INVENTION

The present invention relates to the field of power supplies, and in particular, to checking the charge state of a rechargeable power-supply. The present invention is especially, but not exclusively, applicable to determining at any instant the remaining operational time of a rechargeable power-supply in a cellular mobile telephone.

BACKGROUND OF THE INVENTION

To check the charge state of a battery, and consequently, to be able to possibly determine the remaining operational time of this battery, the amount of charge passing through a resistor connected in series with the battery is measured. One approach currently used includes connecting a voltage-frequency converter to the terminals of the resistor. However, so that the energy consumed in the resistor is as small as possible so as not to cause problems in measuring the amount of charge, it is necessary to have a low enough resistance.

This then requires the use of a high-accuracy converter. However, even in this case, the offset voltage of the converter may prove to be problematic and lead to false information. Moreover, a converter of this type is sensitive to the supply voltage. The result of this is, in particular, a variation in the gain of the converter with a variation in the supply voltage.

Another approach includes using a conventional converter of the delta-sigma type. A converter of this type is found to be very accurate provided a high enough sampling frequency is used. However, this contributes to an increase in the current consumption of the apparatus. To overcome this drawback, it is possible to reduce the sampling frequency, but at the risk of then losing information.

SUMMARY OF THE INVENTION

In view of the foregoing background, an object of the present invention is to check the charge state of a rechargeable power-supply while minimizing any loss of information, and while doing so with low current consumption.

Another object of the present invention is to provide a checking device of this type which overcomes variations in the supply voltage.

These and other objects, advantages and features according to the present invention are provided by a method of checking the charge state of power-supply, and in particular, a rechargeable battery, by measuring an amount of charge passing through a resistor connected in series with the power-supply.

According to a general characteristic of the invention, the measurement of the amount of charge may comprise:

an analog integration over a predetermined integration time of an overall current equal to the sum of a current called a resistor current representative of that passing through the resistor, and of a predetermined reference current capable of selectively taking two opposite values of absolute value greater than the value of the resistor current;

successive comparisons throughout the integration time of the corresponding successive results of the integration with a comparison reference, for example, a zero voltage;

successive selections of one of the two opposite values of the reference current depending on the successive results of the comparisons; and a count over the integration time of the number of times where one of the two opposite values was selected, for example, the number of times where the positive value of the reference current was selected, and the result of this count is representative of the amount of charge.

According to one embodiment of the method, the counting step involves the incrementation of a counter each time the value in question is selected (for example, the positive value of the reference current) and the non-incrementation of the counter each time the opposite value (for example, the negative value of the reference current) is selected. Half the value of the integration time is then subtracted from the counter value. The result of this subtraction furnishes a value representative of the amount of charge.

The result of this subtraction can be obtained simply by taking the two's complement of the contents of the counter. This two's complement is obtained by inverting the binary value of the significant bit of the counter value.

According to one embodiment of the method applicable to a differential measurement of the current passing through the resistor, the integration phase involves reversing the polarity of the differential measurement at half the integration time and continuing the integration for the second half of the integration time with the polarity inverted in this way. Moreover, during the polarity reversal, the values of the results of the comparisons are also reversed. This embodiment makes it possible, when the integration is carried out by an operational amplifier, to compensate for the offset voltage of this operational amplifier.

It is also possible to determine the remaining operational time of the power-supply at a given instant from the accumulation at this instant of the amount of charge measured during successive integration times, and from a calculation of the current consumption at this given instant. The result of the count over a predetermined number of previous integration times furnishes, for example, a calculation of this current consumption.

The subject of the invention is also a device for checking the charge state of a power-supply. The device comprises a resistor connected in series with the power-supply, and measurement means connected to the terminals of the resistor for measuring the amount of charge passing through the resistor.

According to a general characteristic of the invention, the measurement means or circuitry may comprise:

an input interface connected to the terminals of the resistor and delivering a resistor current;

a reference interface delivering a predetermined reference current capable of selectively taking two opposite values with an absolute value greater than the value of the resistor current;

provision means capable of providing a predetermined integration time;

analog integration means capable of carrying out an integration over the integration time, of an overall current equal to the sum of the resistor current and of the reference current;

comparison means capable of carrying out successive comparisons during the integration time of corresponding successive results of the integration with a comparison reference;

selection means capable of successively selecting one of the two opposite values of the reference current depending on the successive results of the comparisons; and counting means capable of counting, over the integration time, the number of times when one of the two opposite values has been selected, the result of this count being representative of the amount of charge.

According to one embodiment of the invention, the integration means may comprise an operational amplifier fed back by a capacitor, receiving the overall current and carrying out a continuous analog integration of the overall current. The provision means may comprise a first counter which is incremented in time with a clock signal up to a maximum counting value corresponding to the integration time. The comparison means may comprise an analog comparator followed by a flip-flop regulated by the clock signal.

According to one embodiment of the invention, the counting means may comprise a second counter incremented each time the value in question is selected, and non-incremented each time the opposite value is selected. Moreover, the counting means may comprise means capable of subtracting half of the maximum counting value of the first counter from the value of the second counter. The result of this subtraction furnishes a value representative of the amount of charge.

The subtraction means may advantageously comprise an inverter connected to the output of the second counter delivering the significant bit. The first counter and the second counter are advantageously asynchronous counters, that is, they are counters whose internal flip-flops do not all switch at the same time. This makes it possible to obtain a very low consumption for these counters.

The device according to the invention advantageously may comprise an analog block and a digital block. The analog block may comprise the input interface, the reference interface, the integration means, and part of the comparison and selection means. The digital block may comprise the means for preparing the integration time, the other part of the comparison and selection means, and the counting means.

The analog block may advantageously have a differential structure which makes it possible to overcome stray capacitances, and consequently, effects of variations in the supply voltage. In a differential structure, the input interface comprises a differential input formed from two terminals. It is thus particularly advantageous that the measurement means furthermore comprise chopper means capable of inverting the two terminals at half the integration time. The integration continues during the second half of the integration time with the two terminals thus inverted. The chopper means also is capable of inverting the output signal of the comparator during the second half of the integration time. An embodiment of this sort makes it possible to compensate for the offset of the operational amplifier forming the integrator.

The chopper means may comprise, for example, an inverter connected to the two terminals of the input interface. This inverter is controllable by the value of the significant bit of the first counter, that is, the counter which determines the integration time.

Moreover, the chopper means may comprise an EXCLUSIVE OR logic gate. The logic gate includes a first input connected to the output of the significant bit of the first counter, a second input connected to the output of the comparison means, and an output connected to an input of the second counter controlling the incrementation or the non-incrementation of this second counter. This EXCLUSIVE OR logic gate makes it possible to invert the output of the comparator in the second half of the integration time.

To calculate the remaining operational time of the power-supply means, the device may advantageously comprise an accumulation register capable of accumulating the successive count results. Means then calculate the remaining operational time of the power-supply means from the contents of the accumulation register, and from a predetermined number of previous count results.

The subject of the invention is also an apparatus operating with a rechargeable power-supply. In particular, the apparatus may be a cellular mobile telephone incorporating a charge-checking device as defined above.

BRIEF DESCRIPTION OF THE DRAWINGS

Other advantages and characteristics of the invention will become apparent on examining the detailed description of the embodiment, which is in no way limiting, and of the appended drawings in which.

DETAILED DESCRIPTION OF THE PREFERRED EMBODIMENTS

Figure 1:
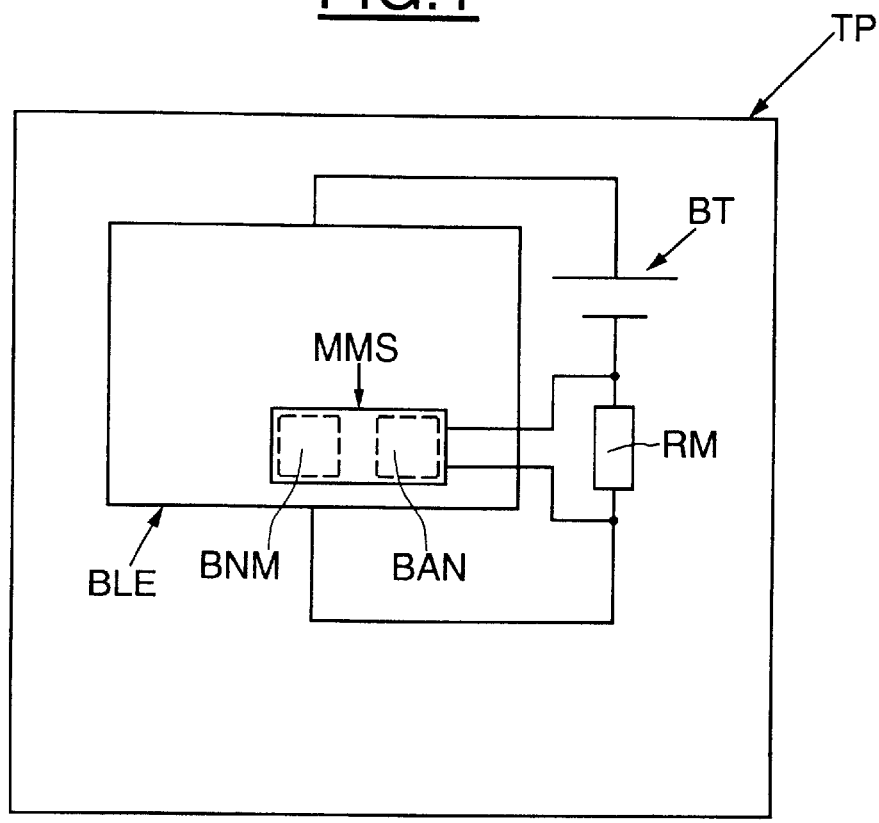
FIG. 1 is a block diagram illustrating a cellular mobile telephone comprising a charge-checking device according to the present invention.

In FIG. 1, the reference TP denotes a cellular mobile telephone comprising a set of electronic components BLE powered by a rechargeable battery BT. To check the charge state of the battery BT, the amount of charge passing through a resistor RM connected in series with the battery is measured using measurement means MMS. As will be seen in more detail below, the measurement means illustratively comprise an analog block BAN and a digital block BNM.

Figure 2:
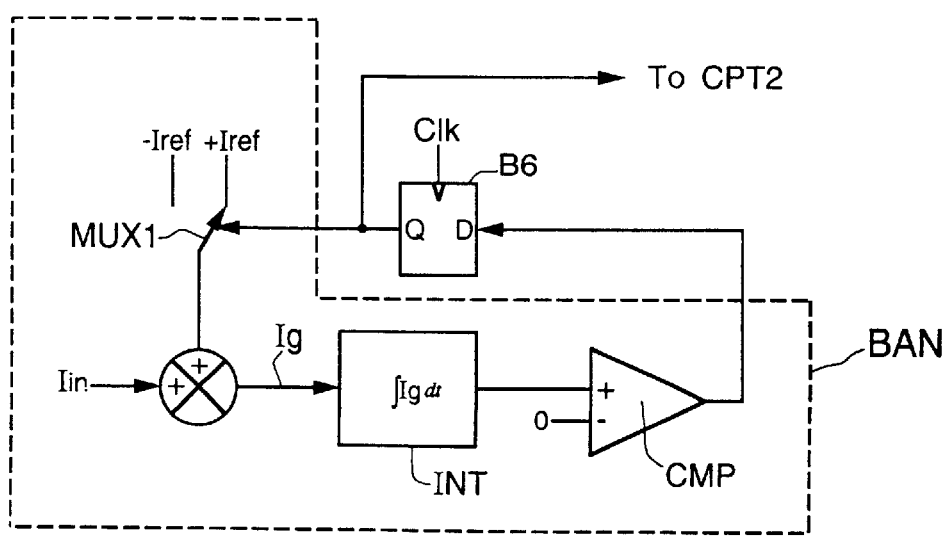
FIG. 2 is a block diagram illustrating the operating principle of an analog block of a charge-checking device according to the present invention.

As illustrated in FIG. 2, a current called the overall current $I_g$, equal to the sum of a current $I_{in}$ representative of the current passing through the resistor RM and of a reference current which may take two opposite values $-I_{ref}$ and $+I_{ref}$, is continually integrated in an integrator INT during an integration time $T_c$. The output voltage of the integrator is continually compared with a comparison reference, in this case, for example, a zero voltage, in an analog comparator CMP. The output signal CMPO of the comparator is then sampled in a flip-flop B6 with a clock signal CLK. The output of the flip-flop B6 therefore furnishes periodically, for example, every 30.5 $\mu$s, the results of successive comparisons during the integration time of corresponding successive results of the integration with the reference voltage.

A switch, for example, a multiplexer MUX1, then successively selects one of the two opposite values $-I_{ref}$, $+I_{ref}$ of the reference current depending on the successive results of the comparisons. The number of times where one of the two opposite values has been selected, for example, the number of times where the value $+I_{ref}$ has been selected, will then be counted over the integration time $T_c$ (for example, about 250 ms). This count will be carried out in the digital block BNM, and the result of this count is representative of the amount of charge which has passed through the resistor during the integration time.

This is because, at the end of each period of the clock signal, the output voltage $V_c$ of the integrator is compared to the reference voltage, in this case 0 volts. If the voltage $V_c$ is positive, then the value $+I_{ref}$ is selected for the following period. Otherwise, the value $-I_{ref}$ is selected.

The loop then tends to keep the voltage $V_c$ close to the reference value, that is, close to 0 volts. To this end, it is desired for the absolute value of the reference current to be greater than the absolute value of the current $I_{in}$. The upper limit of the current $I_{ref}$ will be determined by a person skilled in the art based upon the characteristics of the integrator, and especially the value of the capacitor which is part of this integrator.

As will be seen in more detail below, a counter CPT2 is incremented by 1 each time the value $I_{ref}$ is selected, and is not incremented when the value $-I_{ref}$ is selected. After N periods of the clock signal CLK defining the integration time, the value d of the counter CPT2 is noted. If D and the difference d-N/2 are noted, then it is shown that D is proportional to the integral of the current $I_{in}$ over the integration time, and consequently, proportional to the integral of the current having passed through the measurement resistor RM. D therefore furnishes a picture of the amount of charge having passed through the resistor RM.

Figure 3:
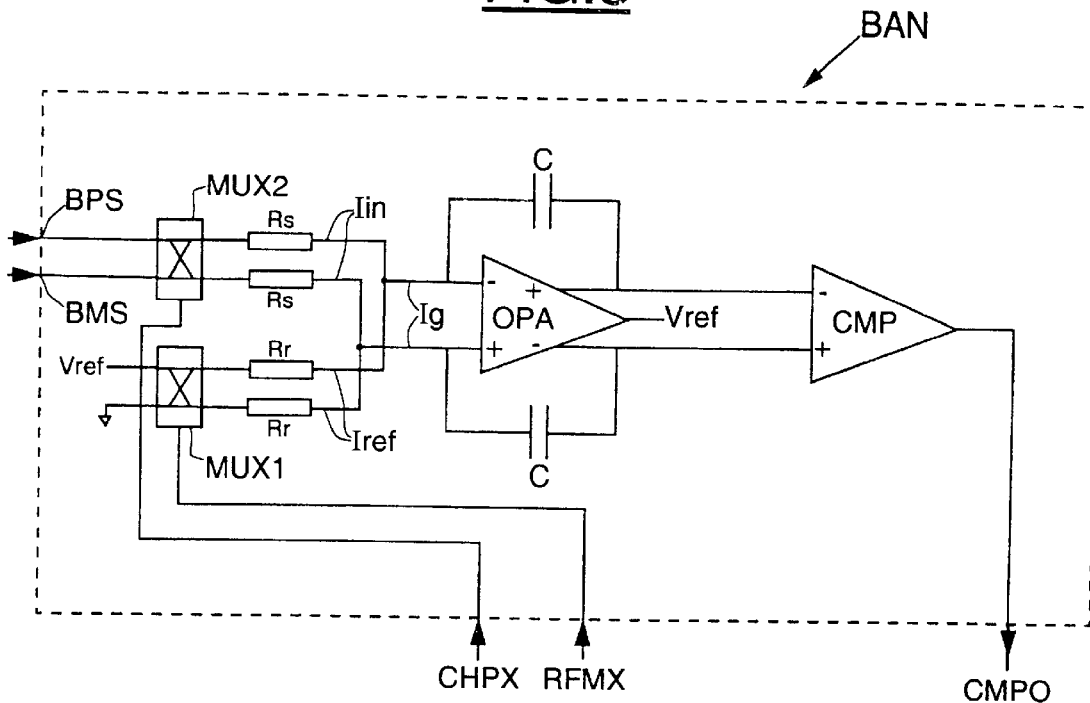
FIG. 3 is a schematic diagram illustrating an embodiment of an analog block with a differential structure according to the present invention.

FIG. 3 illustrates in more detail a differential embodiment of the analog block BAN. More specifically, the block BAN comprises an input interface. In this case, the input interface comprises two terminals BPS and BMS respectively connected to the two terminals of the measurement resistor RM. Moreover, the input interface comprises two resistors $R_s$. The input interface therefore delivers the current $I_{in}$ which is representative of the current passing through the measurement resistor RM.

The analog block BAN moreover comprises a reference interface comprising a first terminal connected to the reference voltage $V_{ref}$, and a second terminal connected to ground. Moreover, this reference interface comprises a resistor $R_r$ delivering the current $I_{ref}$.

The multiplexer MUX1 of the selection means is in this case connected between the two terminals of the reference interface, and is consequently capable of reversing the connection of these two terminals so as to selectively deliver the two opposite values of the reference current, that is, the values $+I_{ref}$ and $-I_{ref}$.

The gain is fixed with respect to the resistors $R_s/R_r$. It is equal to $V_{ref}/|V_{in,max}|$ where $V_{in,max}$ denotes the maximum voltage at the terminals of the measurement resistor. The ratio $R_s/R_r$ must be chosen such that $|I_{ref}|>|I_{in}|$. By way of example, a ratio of $R_r/R_s$ equal to 20 is chosen, with $R_r$ equal to 4 MΩ and $R_s$ equal to 200 kΩ. The respective output terminals of the input and reference interfaces are connected together such that the overall current $I_g$ is equal to the sum of the current $I_{in}$ and of the current $I_{ref}$.

The integrator INT is formed in this case from an operational amplifier OPA fed back by a capacitor C. The operational amplifier OPA has a reference input for receiving a reference voltage which makes it possible to set the common mode voltage. To this end, it is possible to choose the voltage $V_{ref}$ as the reference voltage.

Figure 4:
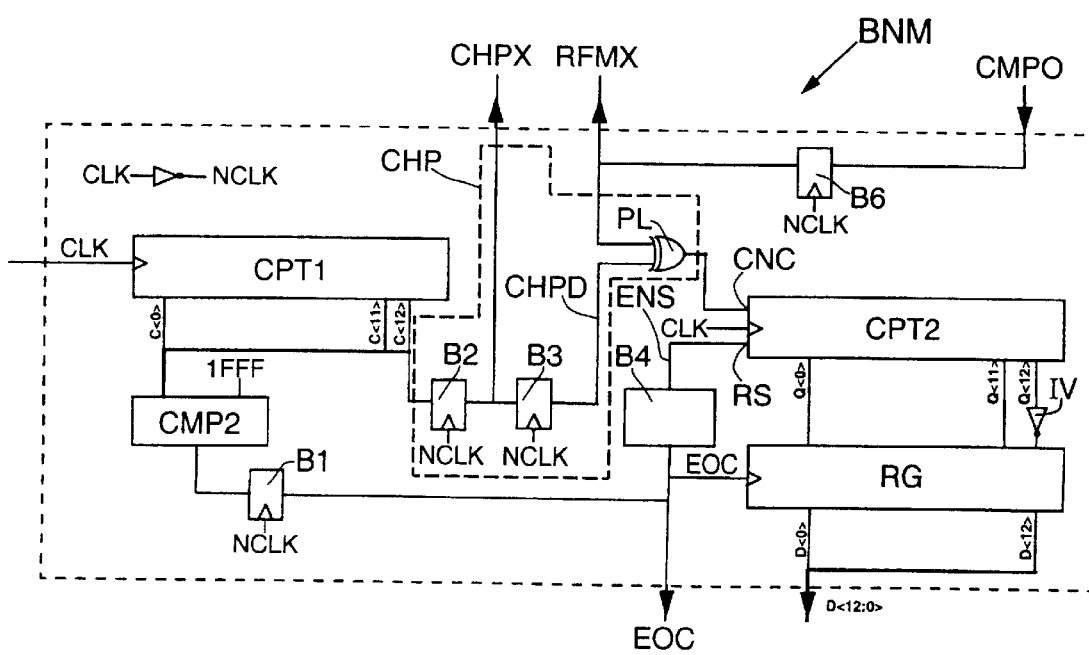
FIG. 4 is a schematic diagram of the internal architecture of a digital block according to the present invention.

The differential output voltage $V_c$ of the integrator is delivered to the two input terminals of an analog comparator CMP. Consequently, the comparator compares the voltage difference $V_c$ at its two input terminals with the value 0. The output signal CMPO of the comparator CMP is then delivered to the input of the flip-flop B6 of the digital block BMN illustrated in FIG. 4. In this embodiment, the flip-flop B6 is controlled on the rising edges of the signal NCLK, that is, on the falling edges of the clock signal CLK.

Moreover, the digital block BNM comprises means called chopper means CHP, the meaning and function of which will be covered in more detail below. This being so, these means CHP, although advantageous, are not indispensable. Initially, it will be assumed that they are not incorporated in the block BNM. In this case, the output of the flip-flop B6 which delivers the selection signal RFMX to the multiplexer MUX1 is also directly connected to the incrementation/non-incrementation input CNC of the counter CPT2.

This counter CPT2 is regulated by the clock signal CLK. Consequently, it is capable of being incremented in time with the rising edges of the clock signal CLK depending on the value of the signal RFMX at the input CNC. In the example described here, if the voltage difference $V_c$ is positive, then during the following period of the clock signal CLK, the resistor $R_r$ will be connected to $+V_{ref}$. If $V_c$ is negative, then $R_r$ will be connected to $-V_{ref}$. In other words, the two input terminals of the reference interface will be reversed using the multiplexer MUX1.

Under these conditions, the counter CPT2 is incremented by 1 each time the resistor $R_r$ is connected to $-V_{ref}$, and is not incremented each time the resistor $R_r$ is connected to $+V_{ref}$. Moreover, it is assumed in the example described here, that the word contained in the counter CPT2 is a word Q of 13 bits. The 13 data outputs of the counter CPT2 are connected to the 13 inputs of a register RG. However, the output of the significant bit of the word contained in the counter CPT2, that is, in this case the output Q<12>, is connected to the corresponding input of the register RG via an inverter IV. Consequently, the given word D contained in the register RG is equal to the two's complement of the difference between the word Q contained in the counter CPT2 and N/2, where N denotes the maximum counting value of a counter CPT1 which will determine the integration time.

More specifically, this first counter CPT1 is incremented by 1 in time with the rising edges of the clock signal CLK. The counting word C, also over 13 bits in the example described and contained in the counter CPT1, is compared in a comparator CMP2 with the maximum counting value N, which is in this case equal to 1FFF, that is, to 8192.

The output of the comparator CMP2 is connected, via a flip-flop B1, to the validation input of the register RG. When the maximum counting value of the counter CPT1 is reached, the end-of-counting signal EOC, delivered by the flip-flop B1, changes over to the high state and the word contained in the counter CPT1 is then transferred into the register RG. The word D contained in the register RG thus represents the amount of charge having passed through the measurement resistor RM during the integration time which has just elapsed.

Figure 5:
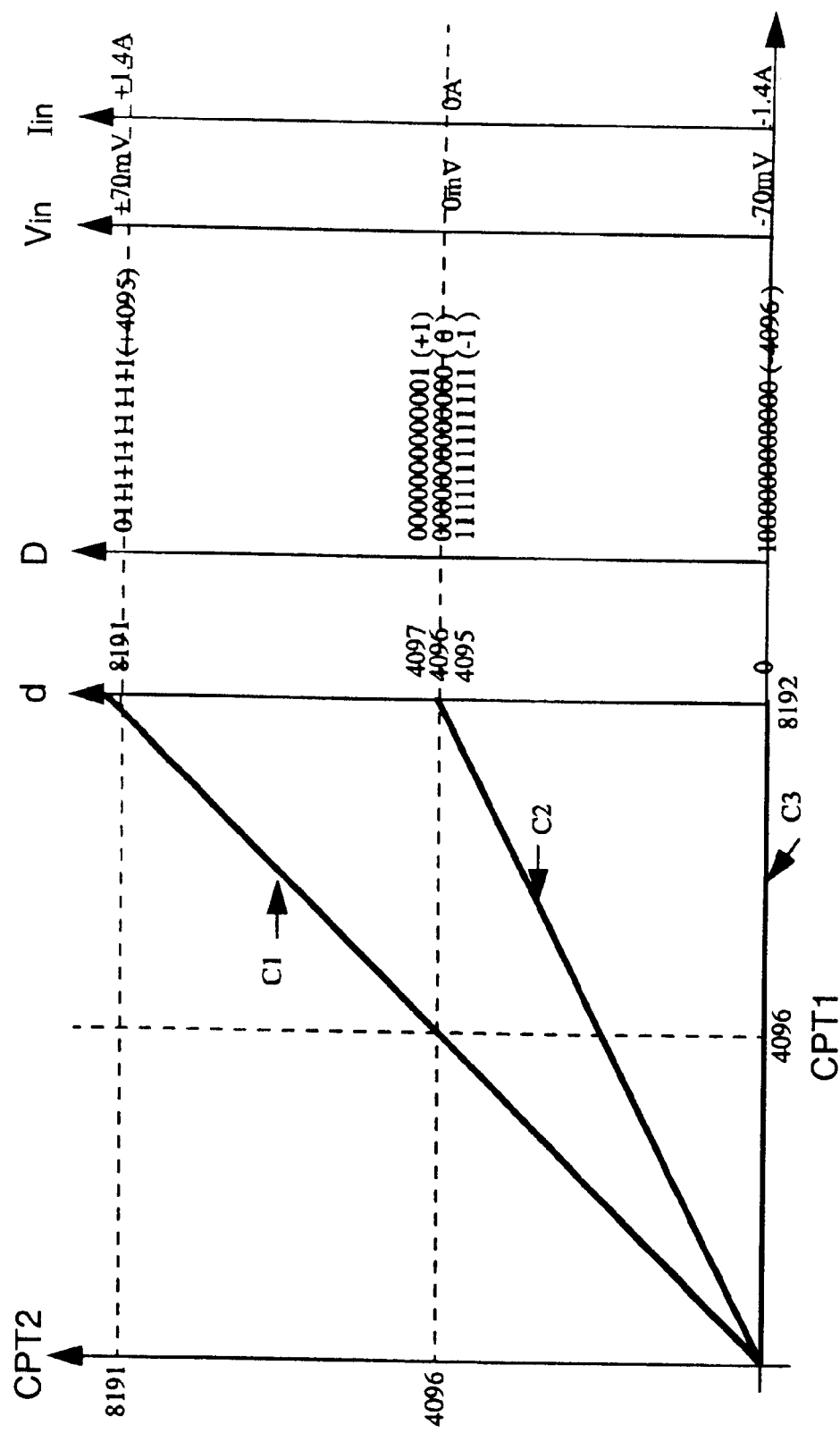
FIG. 5 is a graph illustrating a count of the amount of charge over one integration time according to the present invention.

In FIG. 5, the 8192 edges of the clock signal which control the counter CPT2 are shown on the y-axis. In the left part of FIG. 5, the 8192 edges of the clock signal which control the counter CPT1 are shown on the x-axis. The value d shows the final value of the counter CPT2 at the end of the integration time, that is, when the counter CPT1 has reached the final counting value N (1FFF). C1 shows the change in the contents of the counter CPT2, where the value +$I_{ref}$ of the reference current is continually selected throughout the integration time.

The curve C3 shows the change in the value of the counter CPT2 when the value –$I_{ref}$ is continually selected throughout the integration time. The curve C2 shows the change in the value of the counter CPT2 with a zero input current $I_{in}$, moreover, by assuming that there is no offset of the operational amplifier. It is therefore seen that, for the curve C1, the final value d of the counter CPT2 is equal to 8191. It is equal to 4096 for the curve C2 and to 0 for the curve C3. In this case, D represents the two's complement value of the value d. This value D also corresponds to d-N/2. This value D is the value of the register RG when the signal EOC takes the value 1. It is obtained by reversing the significant bit of the word d.

Figure 6:
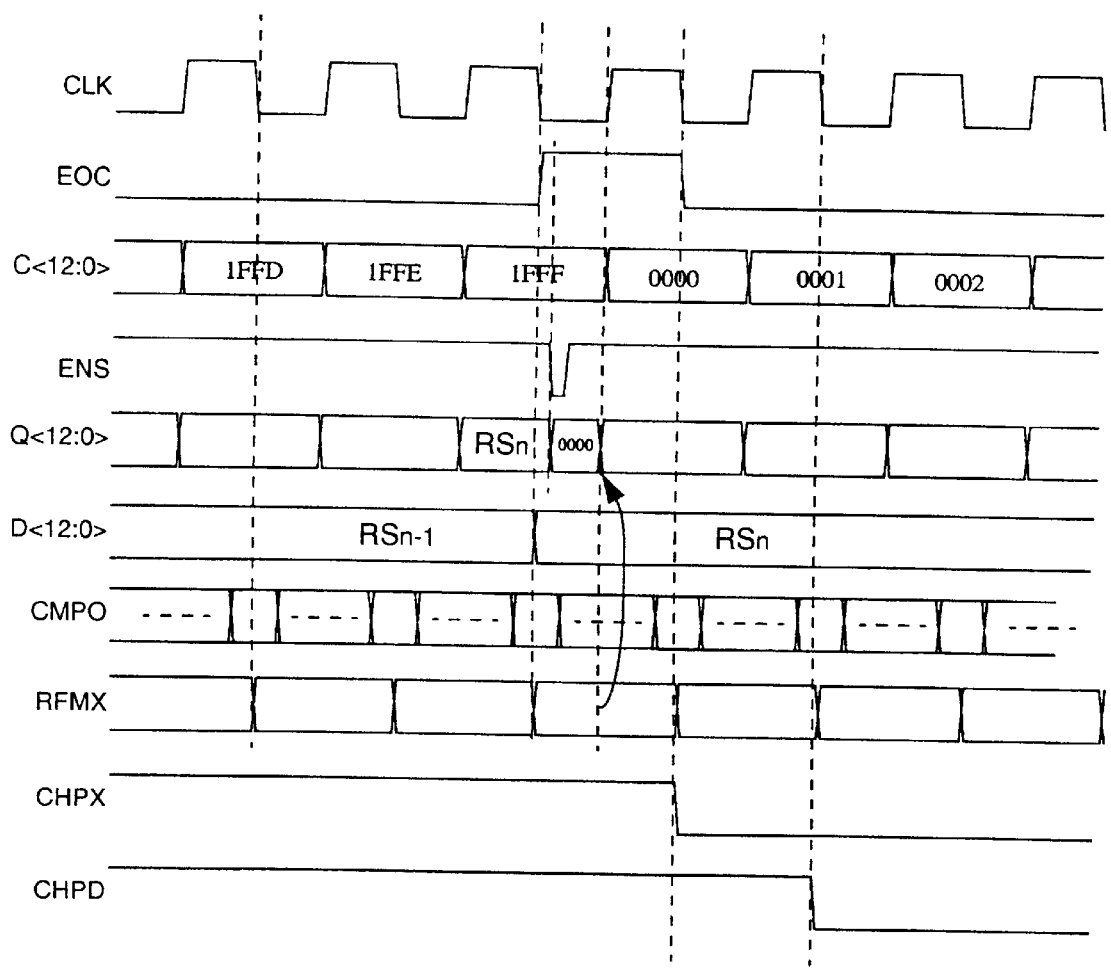
FIG. 6 is a timing diagram illustrating an embodiment of the method according to the present invention.

By way of example, the right part of FIG. 5 gives corresponding indicative examples of the voltage $V_{in}$ at the terminals of the measurement resistor RM and of the current $I_{in}$. The operation of the digital block BMN will now be described, particularly with reference to FIG. 6.

When the end-of-counting signal EOC takes the value 1, that is, when the final counting value 1FFF is reached, the contents Q of the counter CPT2 is transferred to the register RG. Moreover (FIG. 4), the output of the flip-flop B1 is connected to the return-to-zero input RS of the counter CPT2 via a flip-flop B4 which introduces a delay between the input signal EOC and the output signal ENS. This makes it possible, first, to transfer the result contained in the counter CPT2 into the register RG before resetting the counter CPT2 to zero. Moreover, it can be seen that, in time with the falling edges of the clock signal CLK, the signal RFMX may take two distinct values depending on the sign of the value of the signal CMPO.

The structure and the function of the chopper means CHP will now be covered. These chopper means CHP comprise a flip-flop B2 connected to the output of the significant bit of the counter CPT1, and delivers a chopper signal CHPX. Another flip-flop B3 is connected between the output of the flip-flop B2 and one input of a logic gate PL of the EXCLUSIVE OR type. The other input of this logic gate PL is connected to the output of the flip-flop B6, and consequently, receives the signal RFMX. The output of the logic gate PL is connected to the incrementation/non-incrementation input CNC of the counter CPT2. The logic gate PL therefore carries out an EXCLUSIVE OR function between the signal CHPD coming from the logic gate B3 and the signal RFMX coming from the flip-flop B6.

The chopper signal CHPX controls a second multiplexer MUX2 connected to the two terminals BPS and BMS of the input interface, and is capable, depending on the value of the signal CHPX, either of reversing or not reversing the connection of these two terminals. Thus, the chopper means CHP will invert the connection of the two terminals BPS and BMS via the multiplexer MUX2 and the signal CHPX, at half the integration time. This instant is defined by the value of the significant bit C<12> of the word contained in the counter CPT1.

Moreover, the logic gate PL makes it possible to compensate for the effect of this reversal with regard to the decision of whether or not to increment the counter CPT2.

These chopper means CHP thus make it possible to compensate for the offset of the operational amplifier OPA.

Figure 7:
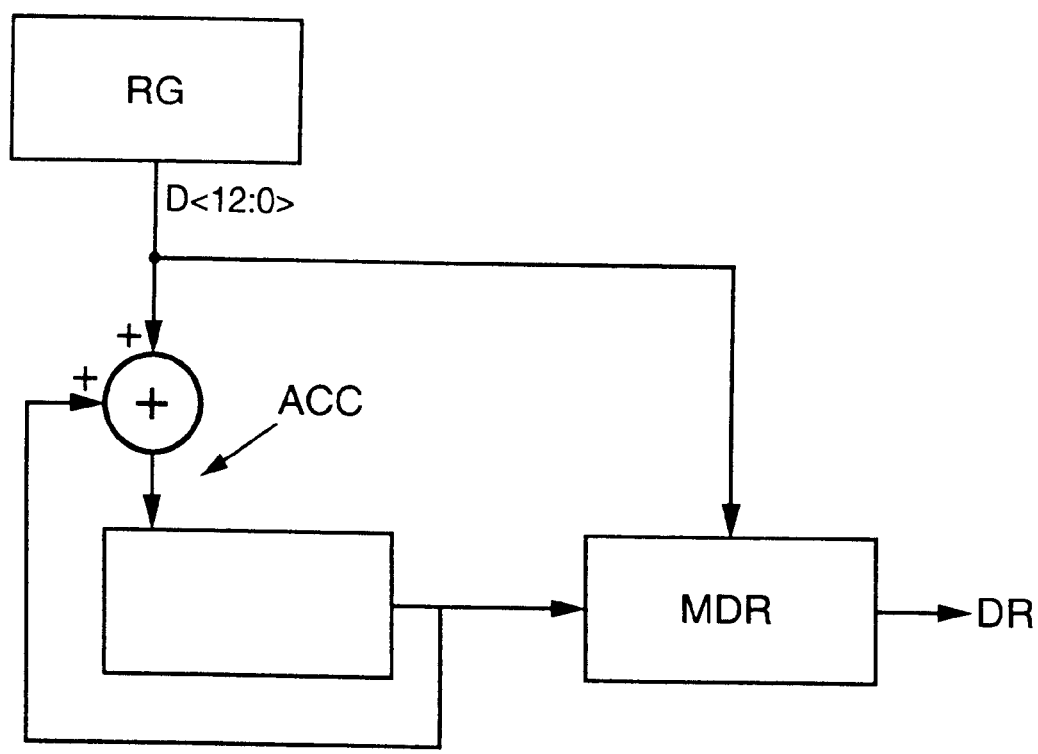
FIG. 7 is a block diagram illustrating means for calculating the remaining operational time of a power-supply according to the present invention.

Moreover, the device according to the present invention may comprise an accumulation register ACC (FIG. 7) capable of accumulating the successive count results contained in the register RG. This accumulation is carried out with the rising of the end-of-counting signal EOC to 1.

Moreover, means MDR make it possible to calculate the remaining operational time DR of the battery from the content of the accumulation register, and from at least the last count result, that is, the last content of the register RG. This is because this last content is representative of the current consumption over the last integration time. Dividing the content of the accumulation register by the content of the register RG, carried out in the means MDR, makes it possible to determine this remaining time. With this being so, in practice and especially in a mobile telephone application, it will be preferred to use the mean of a predetermined number of previous count results to calculate the current consumption.

That which is claimed is:

1. A method of checking a charge state of a rechargeable power-supply, the method comprising:

measuring an amount of charge passing through a resistor connected in series with the rechargeable power-supply, the measuring comprising
      successively integrating over an integration time an overall current equal to a sum of a resistor current passing through the resistor and of a reference current that selectively equals one of two opposite values, the reference current having an and absolute value greater than the resistor current,
      successively comparing throughout the integration time successive results of the integration with a comparison reference,
      successively selecting one of the two opposite values of the reference current throughout the integration time based upon results of the successive comparisons, and
      counting during the integration time a number of times when one of the two opposite values of the reference current was selected, with a result of this count corresponding to the amount of charge passing through the resistor which corresponds to the charge state of the rechargeable power-supply.

2. A method according to claim 1, wherein the counting comprises:
   incrementing a first counter each time one of the two opposite values of the reference current has been selected, and not incrementing the first counter each time the opposite value of the reference current is selected; and
   subtracting one-half of a maximum count value during the integration time from a value of the first counter, and a result of this subtraction corresponding to the amount of charge passing through the resistor.

3. A method according to claim 2, wherein the subtracting further comprises determining a two's complement of the result of the subtraction, and determining the two's complement comprises inverting a binary value of a significant bit of the value of the first counter.

4. A method according to claim 1, wherein measuring the amount of current passing through the resistor is a differential measurement; wherein successively integrating over the integration time comprises reversing a polarity of the differential measurement for a first-half the integration time and continuing the integration for a second-half of the integration time with the polarity reversed; and wherein successively comparing throughout the integration time comprises reversing values of the comparisons during the polarity reversal.

5. A method according to claim 1, further comprising determining a remaining operational time of the rechargeable power-supply at a given instant based upon an accumulation of the amount of charge measured during the integration, and based upon calculation of a current consumption.

6. A method according to claim 5, wherein calculation of the current consumption is based upon counting over a predetermined number of previous integrations.

7. A device for checking a charge state of a rechargeable power-supply, the device comprising:
  a resistor connected in series with the rechargeable power-supply;
  measurement means connected across said resistor for measuring an amount of charge passing through said resistor, said measurement means comprising
    provision means for providing an integration time,
    integration means for successively integrating over the integration time an overall current equal to a sum of a resistor current passing through said resistor and of a reference current that selectively equals one of two opposite values, the reference current having an and absolute value greater than the resistor current,
    comparison means connected to an output of said integration means for successively comparing throughout the integration time successive results of the integration with a comparison reference,
    selection means connected between the output of said comparison means and an input of said integration means for successively selecting throughout the integration time one of the two opposite values of the reference current based upon results of the successive comparisons, and
    counting means connected to said provision means and to the output of said comparison means for counting during the integration time a number of times when one of the two opposite values of the reference current was selected, with a result of this count corresponding to the amount of charge passing through said resistor which corresponds to the charge state of the rechargeable power-supply.

8. A device according to claim 7, wherein said measurement means include an input interface connected to said resistor for providing the resistor current to said integration means, and a reference interface for providing the reference current to said integration means.

9. A device according to claim 8, wherein the input interface, the reference interface, said integration means, a first portion of said comparison means and a first portion of said selection means are analog circuits; and wherein said provision means, said counting means, a second portion of said comparison means and a second portion of said selection means are digital circuits.

10. A device according to claim 7, wherein said integration means comprise:
  an operational amplifier having first and second inputs, and first and second outputs for carrying out a continuous analog integration of the overall current;
  a first feedback capacitor connected between the first input and the first output; and
  a second feedback capacitor connected between the second input and the second output.

11. A device according to claim 7, wherein said provision means comprise a first counter that is incremented with a clock signal up to a maximum counting value corresponding to the integration time.

12. A device according to claim 7, wherein said comparison means comprise an analog comparator; said measurement means further comprising a flip-flop connected to the output of said analog comparator, and said flip-flop being regulated by a clock signal.

13. A device according to claim 11, wherein said counting means comprise:
  a second counter that is incremented each time one of the two opposite values of the reference current is selected, and is not incremented each time the opposite value is selected; and
  subtraction means for subtracting half of the maximum counting value of said first counter from a value of said second counter, and a result of this subtraction corresponding to the amount of charge passing through said resistor.

14. A device according to claim 13, wherein said subtraction means comprise an inverter connected to an output of said second counter providing a significant bit of the value of said second counter.

15. A device according to claim 13, wherein said first counter and said second counter are asynchronous counters.

16. A device according to claim 8, wherein the input interface has a differential input including first and second terminals respectively connected to first and second terminals of said resistor; and said measurement means further comprising chopper means for reversing connection of the first and second terminals of the input interface at a first-half of the integration time, the integration continuing during a second-half of the integration time with connection of the first and second terminals being reversed, and an output value from said comparison means being reversed during the second-half of the integration time.

17. A device according to claim 16, wherein said provision means comprise a first counter and said counting means comprise a second counter; and wherein said chopper means comprise:
  an inverter connected to the first and second terminals of the input interface, said inverter being controlled by a value of a significant bit of said first counter; and
  an EXCLUSIVE OR logic gate having a first input connected to an output of said first counter providing the significant bit, a second input connected to the output of said comparison means, and an output connected to an input of said second counter for controlling incrementing thereof.

18. A device according to claim 7, further comprising:
  an accumulation register connected to an output of said counting means for accumulating the successive count results; and
  calculation means connected to said accumulation register for calculating a remaining operational time of the rechargeable power-supply based upon contents of said accumulation register and from a predetermined number of previous count results.

19. A device for checking a charge state of a battery power-supply by measuring an amount of charge passing through a resistor connected in series with the battery power-supply, the device comprising:
  a first counter for providing an integration time;
  an integrator for successively integrating over the integration time an overall current equal to a sum of a resistor current passing through the resistor and of a reference current that selectively equals one of two opposite values;

a comparator connected to an output of said integrator for successively comparing throughout the integration time successive results of the integration with a comparison reference;

a selector connected between the output of said comparator and an input of said integrator for successively selecting throughout the integration time one of the two opposite values of the reference current based upon results of the successive comparisons; and a second counter connected to said first counter and to the output of said comparator for counting during the integration time a number of times when one of the two opposite values of the reference current is selected, with a result of this count corresponding to the amount of charge passing through the resistor which corresponds to the charge state of the battery power-supply.

20. A device according to claim 19, wherein the reference current has an absolute value greater than a value of the resistor current.

21. A device according to claim 19, wherein said first counter is incremented with a clock signal up to a maximum counting value corresponding to the integration time.

22. A device according to claim 21, wherein said second counter is incremented each time one of the two opposite values of the reference current is selected, and is not incremented each time the opposite value is selected; and further comprising a register connected to said first and second counters for subtracting half of the maximum counting value of said first counter from a value of said second counter, and a result of this subtraction corresponding to the amount of charge passing through the resistor.

23. A device according to claim 22, further comprising an inverter connected between said second counter and said register for inverting a significant bit of the value of said second counter.

24. A device according to claim 19, wherein said comparator comprises an analog comparator; and further comprising a flip-flop connected to the output of said analog comparator, and said flip-flop being regulated by a clock signal.

25. A device according to claim 19, wherein the input interface, the reference interface, said integrator, a first portion of said comparator and a first portion said selector are analog circuits; and wherein said first counter, said second counter, a second portion of said comparator and a second portion of said selector are digital circuits.

26. A device according to claim 19, further comprising:
a differential input interface including first and second terminals respectively connected to first and second terminals of the resistor for providing the resistor current to said integrator;
a reference interface for providing the reference current to said integrator; and
a chopper circuit for reversing connection of the first and second terminals of the input interface at a first-half of the integration time, the integration continuing during a second-half of the integration time with connection of the first and second terminals being reversed, and an output value from said comparator being reversed during the second-half of the integration time.

27. A device according to claim 19, further comprising:
an accumulation register connected to an output of said second counter for accumulating the successive count results; and a calculation ciructit connected to said accumulation register for calculating a remaining operational time of the rechargeable power-supply based upon contents of said accumulation register and from a predetermined number of previous count results.

28. A cellular mobile telephone comprising:
a rechargeable power-supply;
an electronic component being powered by said rechargeable power-supply; and
a device connected to said rechargeable power-supply for checking a charge state thereof, said checking device comprising
a resistor connected in series with the rechargeable power-supply, and
a measurement circuit connected across said resistor for measuring an amount of charge passing through said resistor, said measurement circuit comprising
a first counter for providing an integration time,
an integrator for successively integrating over the integration time an overall current equal to a sum of a resistor current passing through said resistor and of a reference current that selectively equals one of two opposite values,
a comparator connected to an output of said integrator for successively comparing throughout the integration time successive results of the integration with a comparison reference,
a selector connected between the output of said comparator and an input of said integrator for successively selecting throughout the integration time one of the two opposite values of the reference current based upon results of the successive comparisons, and
a second counter connected to said first counter and to the output of said comparator for counting during the integration time a number of times when one of the two opposite values of the reference current was selected, with a result of this count corresponding to the amount of charge passing through said resistor which corresponds to the charge state of the rechargeable power supply.

29. A cellular mobile telephone according to claim 28, wherein the reference current has an absolute value greater than a value of the resistor current.

30. A cellular mobile telephone according to claim 28, wherein said integrator comprises:
an operational amplifier having first and second inputs, and first and second outputs for carrying out a continuous analog integration of the overall current;
a first feedback capacitor connected between the first input and the first output; and
a second feedback capacitor connected between the second input and the second output.

31. A cellular mobile telephone according to claim 28, wherein said first counter is incremented with a clock signal up to a maximum counting value corresponding to the integration time.

32. A cellular mobile telephone according to claim 31, wherein said second counter is incremented each time one of the two opposite values of the reference current is selected, and is not incremented each time the opposite value is selected; and said measurement circuit further comprising a register connected to said first and second counters for subtracting half of the maximum counting value of said first counter from a value of said second counter, and a result of this subtraction corresponding to the amount of charge passing through said resistor.

33. A cellular mobile telephone according to claim 28, wherein said measurement circuit includes a differential input interface including first and second terminals respectively connected to first and second terminals of said resistor for providing the resistor current to said integrator, and a reference interface for providing the reference current to said integrator; and said measurement circuit further comprising a chopper circuit for reversing connection of the first and second terminals of the input interface at a first-half of the integration time, the integration continuing during a second-half of the integration time with connection of the first and second terminals being reversed, and an output value from said comparator being reversed during the second-half of the integration time.

34. A cellular mobile telephone according to claim 28, further comprising:

an accumulation register connected to an output of said second counter for accumulating the successive count results; and a calculation cirucit connected to said accumulation register for calculating a remaining operational time of the rechargeable power-supply based upon contents of said accumulation register and from a predetermined number of previous count results.

* * * * *

UNITED STATES PATENT AND TRADEMARK OFFICE
CERTIFICATE OF CORRECTION

PATENT NO. : 6,680,615 B2
DATED : January 20, 2004
INVENTOR(S) : Jèrôme Nebon and Louis Tallaron It is certified that error appears in the above-identified patent and that said Letters Patent is hereby corrected as shown below:

Column 8,
Line 32, delete "an and absolute" insert -- an absolute --.

Column 9,
Line 27, delete "an and absolute" insert -- an absolute --.

Signed and Sealed this

Fifteenth Day of November, 2005

JON W. DUDAS
*Director of the United States Patent and Trademark Office*